United States Patent [19]
Chang et al.

[11] Patent Number: 5,674,761
[45] Date of Patent: Oct. 7, 1997

[54] METHOD OF MAKING ESD PROTECTION DEVICE STRUCTURE FOR LOW SUPPLY VOLTAGE APPLICATIONS

[75] Inventors: Kun-Zen Chang; Ching-Yuan Lin, both of Hsinchu, Taiwan

[73] Assignee: Etron Technology, Inc., Hsin-Chu, Taiwan

[21] Appl. No.: 641,768

[22] Filed: May 2, 1996

[51] Int. Cl.$^6$ .................................. H01L 21/8234
[52] U.S. Cl. .................. 437/29; 437/44; 437/58; 437/904
[58] Field of Search ................... 437/29, 30, 44, 437/56, 57, 58, 904

[56] References Cited

U.S. PATENT DOCUMENTS

| | | | |
|---|---|---|---|
| 5,246,872 | 9/1993 | Mortensen | 437/44 |
| 5,262,344 | 11/1993 | Mistry | 437/58 |
| 5,272,097 | 12/1993 | Shiota | 437/904 |
| 5,374,565 | 12/1994 | Hsue et al. | 437/30 |
| 5,529,941 | 6/1996 | Huang | 437/44 |

*Primary Examiner*—Chandra Chaudhari
*Attorney, Agent, or Firm*—George O. Saile

[57] ABSTRACT

A method for forming an ESD protection device, with reduced junction breakdown voltages, while simultaneously forming an integrated circuit, containing FET devices, has been developed. This invention features forming a large area, ESD protection diode, by using a first ion implantation step, of a specific conductivity type, also used for the heavily doped source and drain regions of attached FET devices. After photoresist processing, used to mask the attached FET devices, a second ion implantation step, opposite in conductivity type then the first implant, is used to complete the ESD protection diode, for the ESD protection device. This large area diode reduces junction breakdown voltage, while allowing ESD current to be discharged more efficiently then for smaller ESD protection counterparts.

16 Claims, 6 Drawing Sheets

METHOD OF MAKING ESD PROTECTION DEVICE STRUCTURE FOR LOW SUPPLY VOLTAGE APPLICATIONS

BACKGROUND OF THE INVENTION

(1) Field of the Invention

This invention relates to semiconductor devices, and more specifically to devices used to protect attached integrated circuits from damage due to electrostatic discharge, (ESD), and the processes used to create such devices.

(2) Description of Prior Art

The development of more advanced semiconductor devices, while resulting in performance enhancements, still are predisposed to catastrophic failures, due to electrostatic discharge. During the fabrication, or handling, of integrated circuits, basically composed of field effect transistors, (FET), large electrostatic charges can be transferred from external contacts of the integrated circuit into an internal FET device, resulting in either damage or destruction of the effected FET device. The semiconductor industry has addressed the ESD phenomena by adding protection devices, as part of the integrated circuit, located between the external contacts and the sensitive FET devices. These protection devices are designed to provide a discharge path for ESD, protecting the internal, sensitive FET devices from this damaging charge.

Hsue, et al, in U.S. Pat. No. 5,374,565, describe the fabrication of an ESD protection device, with a reduced junction breakdown voltage. This is accomplished by forming a P/N diode, as part of an N channel, FET protection device. The reduction in junction breakdown voltage allows a greater level of current to be discharged, when compared to protection structures fabricated without a P/N diode, and thus offers increased ESD protection for the attached internal devices. However, the size of the P/N diode described in Hsue, et al, is limited by the fact that the P type ion implantation is performed through contact openings, so that the diode is much smaller than the active area of the protection device.

This invention will describe a process sequence, used to simultaneously fabricate improved input, as well as output, ESD protection devices, and internal circuits, composed of both N channel, (NFET), and P channel, (PFET), devices. This invention features an ESD structure composed of a P/N diode, however in this invention the area of the diode is significantly increased, without increasing the size of the ESD protection device. This device structure is suitable for design and application of future deep sub-micron ultra large scale integration, (ULSI), processes, since the diode size is not related to shrinking contact feature sizes, thus resulting in enhanced ESD protection, when compared to counterparts fabricated with smaller area P/N diodes.

SUMMARY OF THE INVENTION

It is an object of this invention to create an ESD protection device, to protect an attached integrated circuit from electrostatic discharge.

It is another object of this invention to form the ESD protection device simultaneously with the formation of the specific device structures of the attached integrated circuit.

It is yet another object of this invention to use an ESD protection device, featuring an P/N diode, for ESD current discharge.

It is still another object of this invention to increase the area of the P/N diode, enabling a greater level of current to be discharged.

In accordance with the present invention an ESD protection device is formed simultaneously with an integrated circuit, and formed from the same fabrication procedures used to create the FET devices of the integrated circuit. A P well region is created in an N type substrate, via a boron ion implantation procedure, followed by the formation of thick field oxide regions, for purposes of isolation, for both the ESD protection device and the FET device. A gate oxide layer, a polysilicon gate structure, and insulator sidewall spacers are next created for only the FET device. An ion implantation of phosphorous and arsenic is next performed to create both the lightly doped, as well as the heavily doped regions of the attached integrated circuit FET devices, as well as creating N+ regions for the ESD protection device, in areas not covered with the thick field oxide. The uncovered areas of the ESD protection device are then subjected to a boron ion implantation to create an P/N diode.

BRIEF DESCRIPTION OF THE DRAWINGS

The object and other advantages of this invention are best described in the preferred embodiment with reference to the attached drawings that include:

FIGS. 1–6a, which schematically, in cross-sectional style, show the stages of fabrication used to simultaneously create both an input, ESD protection device, and a N channel, FET device.

DESCRIPTION OF THE PREFERRED EMBODIMENTS

Figure 1:
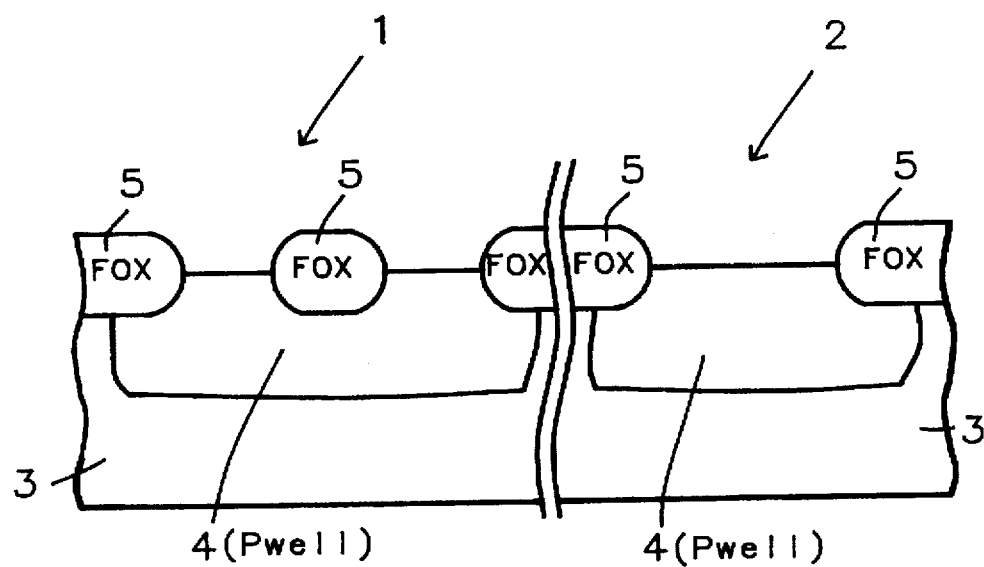

The method of creating an ESD protection device, using a fabrication process sequence, used to create an N channel FET device, will now be described. Referring to FIG. 1, an input, ESD protection device, 1, and an internal FET device, 2, are shown on a semiconductor substrate, 3, composed of P type single crystalline silicon, with a <100> crystallographic orientation. Conventional photolithographic procedures are employed to open an area in a photoresist layer to expose a region in semiconductor substrate, 3, followed by a ion implantation of boron, at an energy between about 80 to 180 KeV, and at a dose between about 1E12 to 5E13 atoms/cm$^2$. Photoresist removal is performed using plasma oxygen ashing, followed by careful wet cleans. Subsequent heat treatments then produce P well region, 4, shown for both the input, ESD protection device, 1, as well as for the FET device, 2. Thick field oxide regions, 5, (FOX), are next formed for both the input, ESD protection device, 1, and the FET device, 2. This is accomplished by thermally growing a thin layer of silicon oxide, followed by a low pressure chemical vapor deposition, (LPCVD), of an overlying silicon nitride layer. Conventional photolithographic, and reactive ion etching, (RIE), procedures, are used to create a patterned composite oxidation mask of silicon nitride on silicon oxide. After photoresist removal, accomplished via plasma oxygen ashing and careful wet cleans, the FOX regions, 5, are created in regions not covered by the composite oxidation mask, using thermal oxidation, at a temperature between about 850° to 1050° C., in an oxygen steam ambient, to a thickness between about 3000 to 8,000 Angstroms. The composite oxidation mask is then removed using a hot phosphoric acid solution for the overlying silicon nitride layer, and a buffered hydrofluoric acid solution for the thin, underlying silicon oxide layer.

Figure 2:
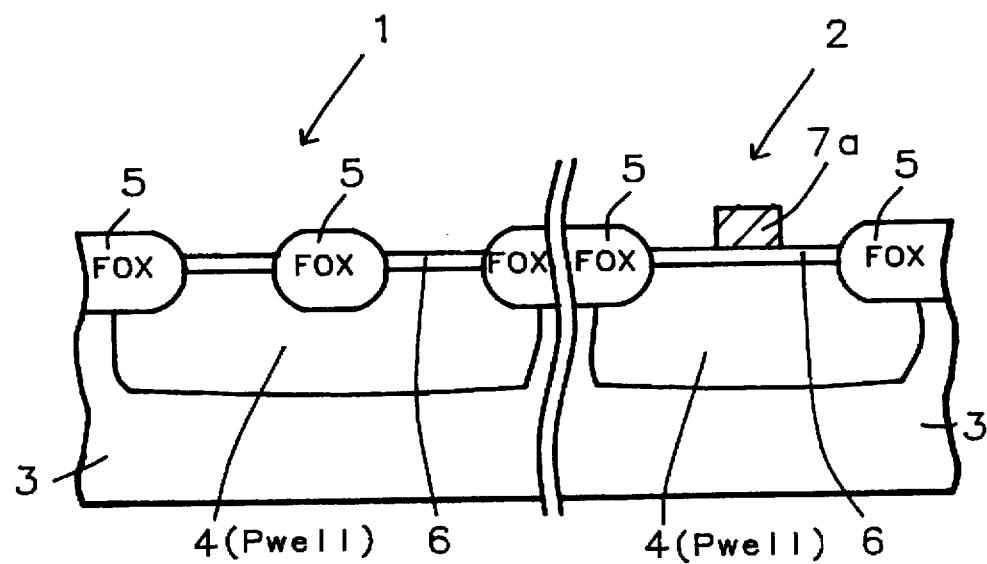

Another thermal oxidation is next performed, in an oxygen-steam ambient, at a temperature between about 800° to 1000° C., to a thickness between about 50 to 300 Angstroms, to produce a silicon dioxide layer, 6, to be used for the gate insulator for the FET device, 2, shown in FIG. 2. A layer of polysilicon is next deposited using LPCVD procedures, at a temperature between about 500° to 650° C., to a thickness between about 1500 to 4500 Angstroms. The polysilicon layer can be deposited using insitu doping procedures by adding either arsine or phosphine to a silane ambient, or the polysilicon layer can be deposited intrinsically, and subjected to an ion implantation procedure, using either arsenic or phosphorous, at an energy between about 30 to 80 KeV, at a dose between about 5E14 to 1E16 atoms/cm$^2$. Conventional photoresist, and RIE procedures, using Cl$_2$ as an etchant, are used to produce a polysilicon gate structure, 7a, for the FET device, 2, shown schematically in FIG. 2. Photoresist removal is once again accomplished via plasma oxygen ashing, followed by careful wet cleans.

Figure 3:
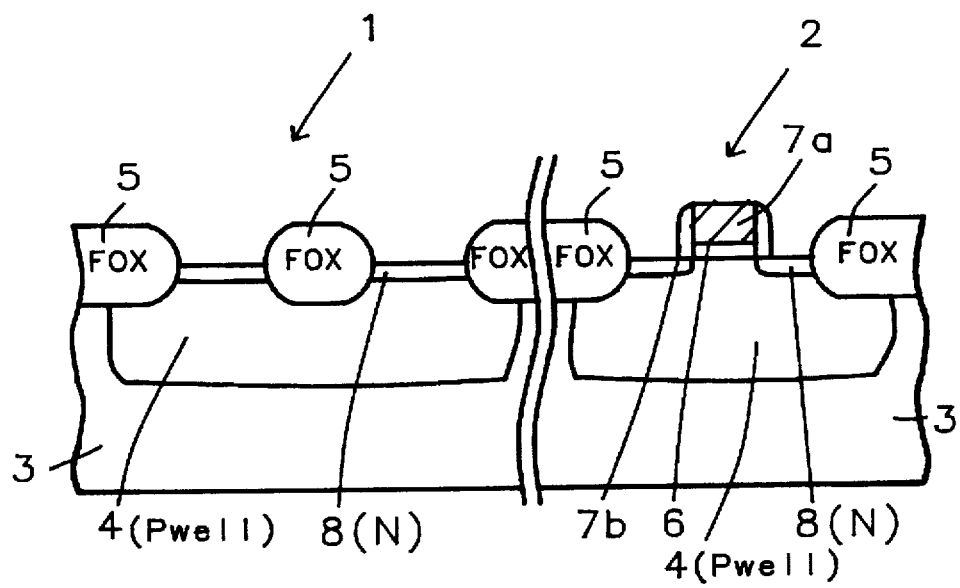
Figure 4:
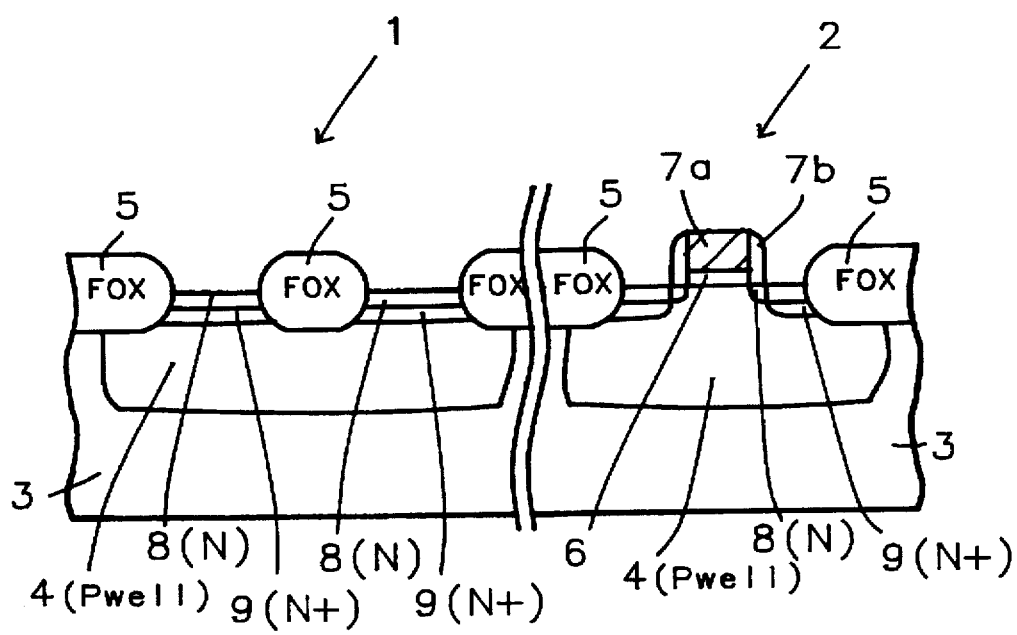

A lightly doped source and drain region, 8, is next formed for the FET device, 2, and is also incorporated in the open regions of the input, ESD protection device, 1. This is accomplished via an ion implantation of phosphorous, at an energy between about 30 to 80 KeV, at a dose between about 1E12 to 5E13 atoms/cm$^2$, and shown schematically in FIG. 3. An insulator layer of silicon oxide is next deposited using either LPCVD or plasma enhanced chemical vapor deposition, (PECVD), procedures, at a temperature between about 400° to 800° C., to a thickness between about 1500 to 4000 Angstroms. A selective, anisotropic RIE procedure, using CHF$_3$ as an etchant, is then used to produce insulator sidewall spacer, 7b, for the FET device, 2, while the silicon oxide layer, as well as gate oxide layer, 6, are removed from the surface of input, ESD protection device, 1. This is schematically shown in FIG. 3. Another ion implantation of arsenic, at an energy between about 50 to 100 KeV, at a dose between about 1E14 to 5E15 atoms/cm$^2$, is used to produce heavily doped source and drain regions, 9, for both the FET device, 2, as well as for the input, ESD protection device, 1, shown schematically in FIG. 4.

Figure 5:
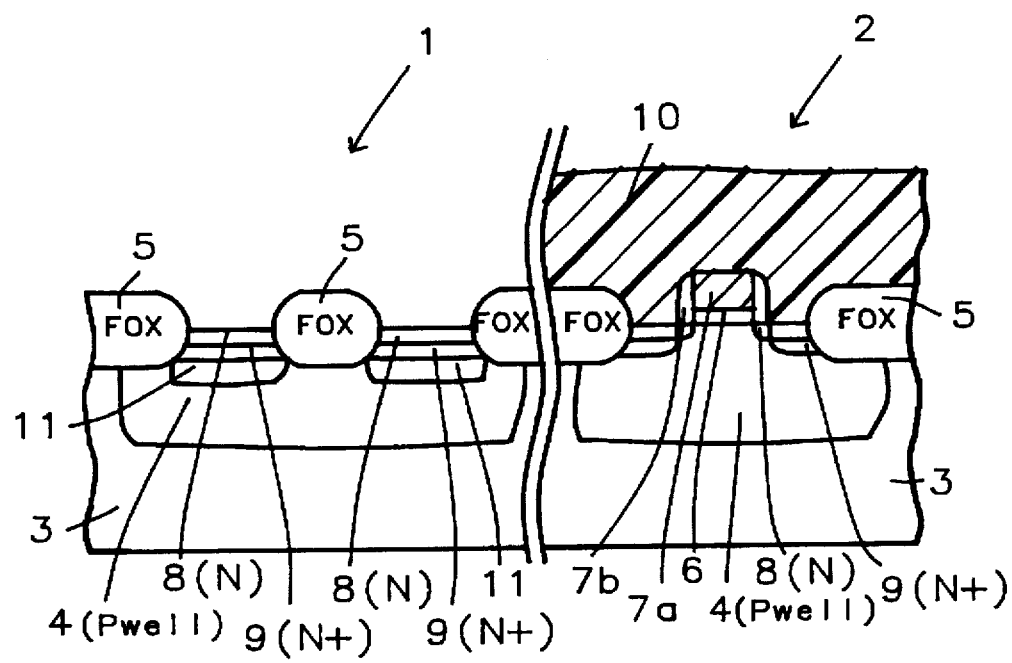

The critical stage of this invention is next addressed, first by blocking FET device, 2, using photoresist mask, 10, shown in FIG. 5. An ion implantation of boron, at an energy between about 25 to 70 KeV, at a dose between about 5E12 to 5E13 atoms/cm$^2$, is used to create P type region, 11, with P type region, 11, possessing a higher level of P type doping then P well region, 4, and creating a P/N diode for the input, ESD protection device, 1. The diode formed, with the increased P type doping, shown schematically in FIG. 5, will reduce the junction breakdown voltage, from a range between about 14 to 12 volts, normally obtained from using just an N+ region, in P well region, 4, to between about 10 to 7 volts. The reduction in breakdown voltage improves the ESD characteristics by allowing a greater level of current to be discharged through the ESD protection device, for a given amount of power. Unlike prior art, in which P/N diodes were formed in only small contact areas of the ESD protection device, this invention utilizes the maximum amount of area for the diode, between about 2 to 20 uM, by between about 50 to 400 uM, thus resulting in a larger area available for ESD current to be discharged. The attainment of the larger area P/N diode was made possible by incorporating the P type implantation step, at a specific stage of fabrication, prior to contact hole opening.

Figure 6A:
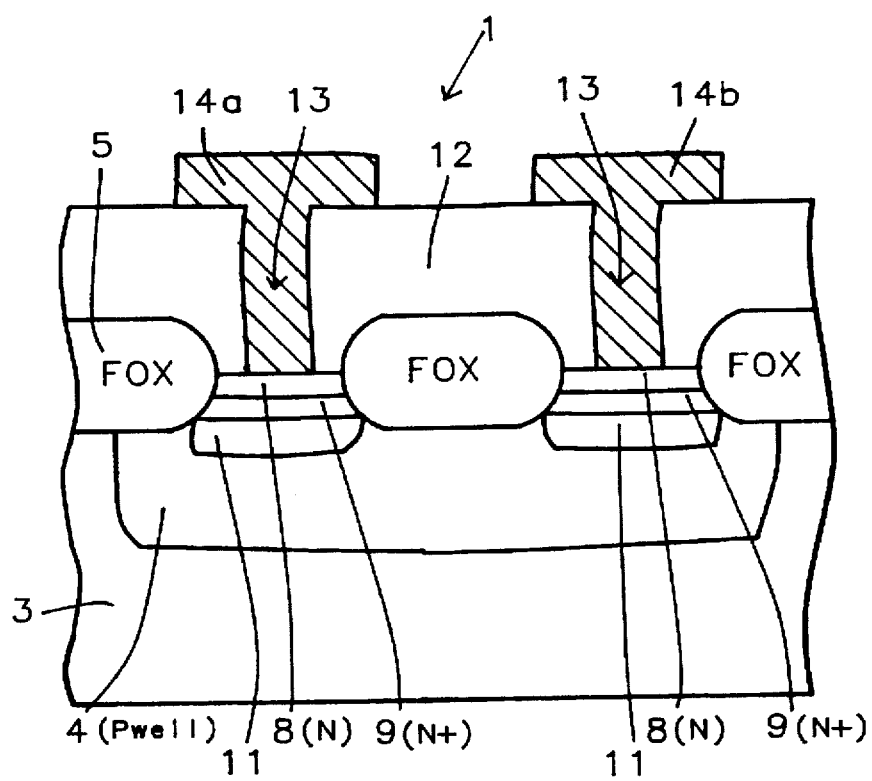
Figure 6B:
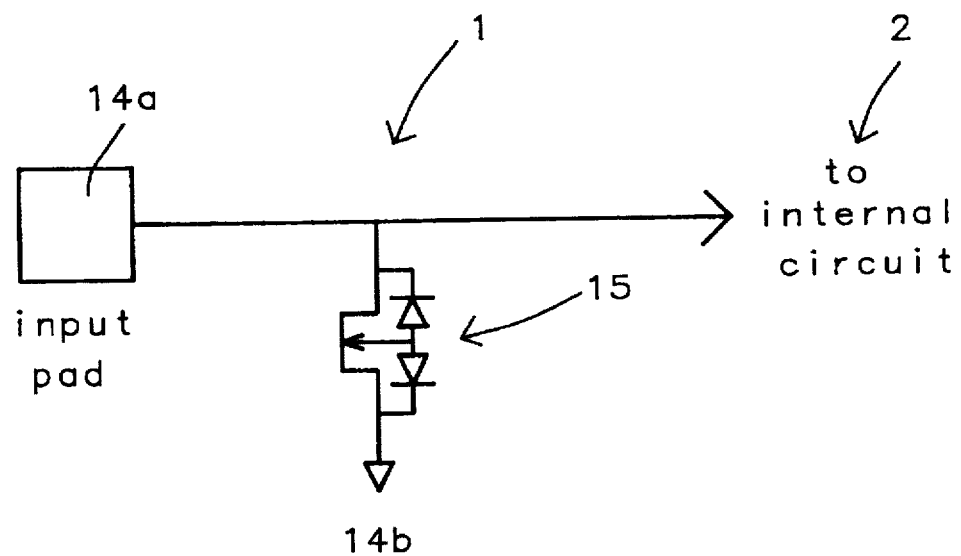
FIG. 6b, a circuit schematic of the input, ESD protection device, formed from a fabrication process used to create an N channel FET device.

Photoresist removal is next performed, again using plasma oxygen ashing followed by careful wet cleans. An insulator layer of silicon oxide, 12, is deposited using either LPCVD or PECVD processing, at a temperature between about 400° to 800° C., to a thickness between about 4000 to 8000 Angstroms. Photoresist and RIE processing, using CHF$_3$ as an etchant, are used to form contact holes, 13, shown schematically in FIG. 6a, for the input, ESD protection device, 1. Contact holes, 13, are also formed for the FET device, 2, although not shown in FIG. 6a. After photoresist removal using plasma oxygen ashing, followed by careful wet cleans, a layer of aluminum, containing between about 0.5 to 3.0% copper, and between about 0 to 2.0% silicon, is deposited using r.f. sputtering procedures, to a thickness between about 3000 to 10000 Angstroms. Standard photoresist and RIE processing, using Cl$_2$ as an etchant, are used to form metal contacts, 14a and 14b, for input, ESD protection device, 1. This is schematically shown in FIG. 6a. Similar metal contacts are created for FET device, 2, however not shown in FIG. 6a. Photoresist removal is again performed using plasma oxygen ashing followed by careful wet cleans. FIG. 6b, shows the circuit diagram for input, ESD protection device, 1. Input pad, 14a, accepts the ESD charge and directs the charge through P/N diode, 15, where the charge is efficiently dissipated. The input ESD protection device of FIG. 6b acts as a parasitic device, only operating when an ESD event causes a voltage at the input pad to exceed the diode breakdown voltage of 7 to 10 volts. During normal circuit operation, when signals range from 0 to 3.3 volts, the ESD device is off.

Figure 7:
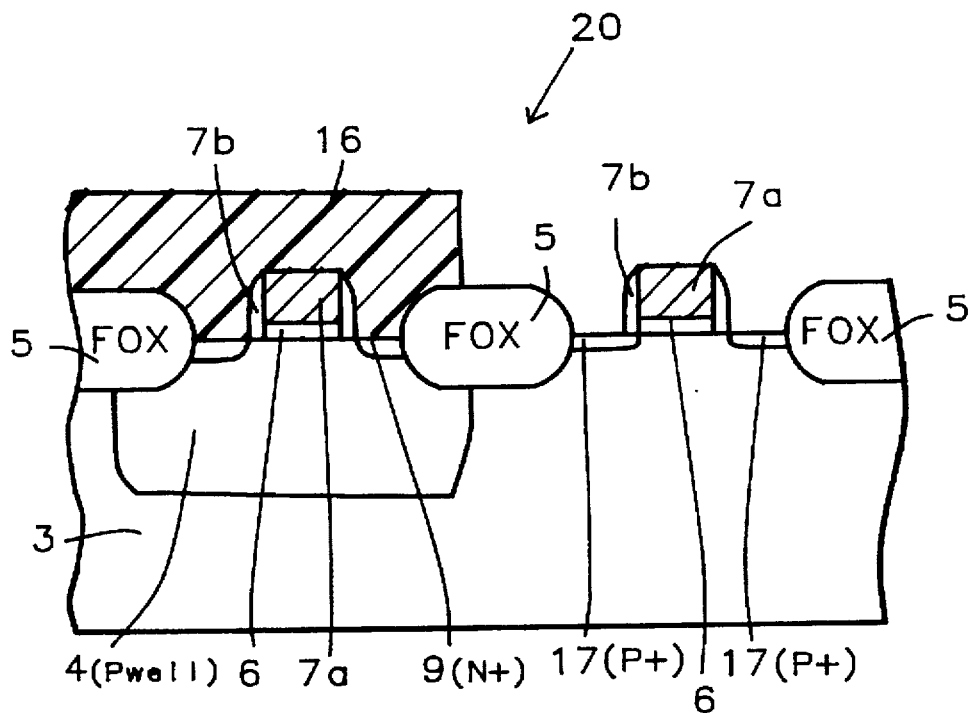
FIGS. 7–8, which schematically, in cross-sectional style, show the stages of fabrication used to simultaneously create both an output, ESD protection device, and a N channel, FET device.
Figure 8:
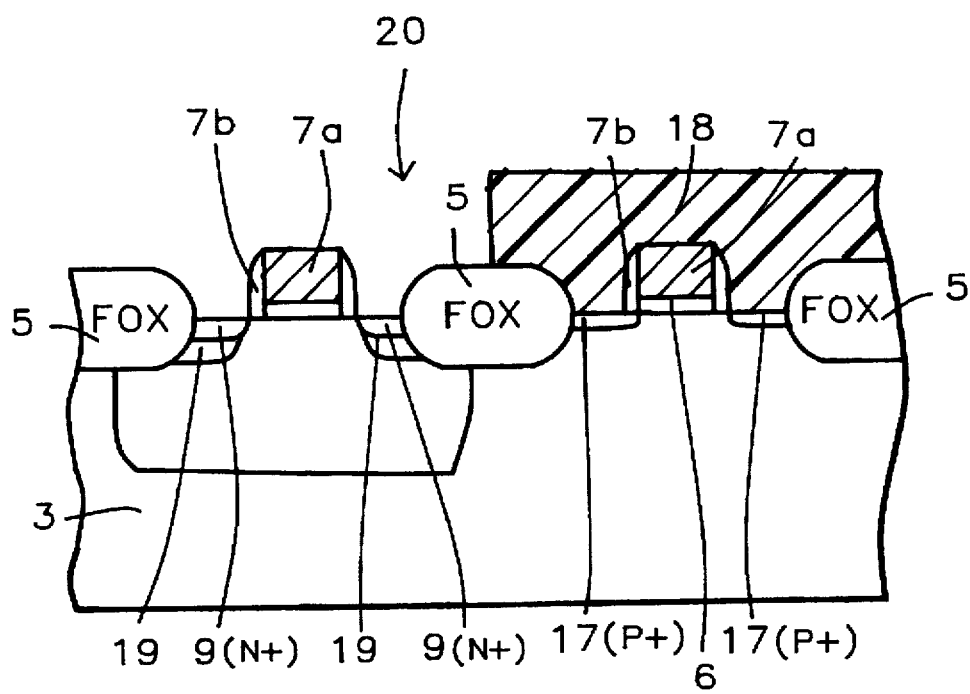

FIGS. 7–8, illustrate the use of this invention, for ESD protection for an input/output, (I/O), device, 20. The I/O device, 20, is formed using similar processing steps, previously described for the input, ESD protection device, 1. However for this structure the ESD protection device consists of a P channel, FET device, and a N channel FET device, with the subsequent P/N diode being formed in the N channel FET device. The P channel section is formed by blocking the N channel FET device with photoresist mask, 16, and creating P+ source and drain regions, 17, via ion implantation of boron, at an energy between about 25 to 60 KeV, at a dose between about 1E14 to 5E14 atoms/cm$^2$. This is shown schematically in FIG. 7. After photoresist removal, using plasma oxygen ashing and careful wet cleans, another photoresist blockout mask, 18, is formed, to protect the P channel FET device. This is shown schematically in FIG. 8. A P/N diode is now formed, in opened regions of the N channel device, similar to the diode formed for the input, ESD protection device previously described and shown in FIG. 5. The diode is formed by ion implantation of boron at an energy between about 25 to 70 KeV, at a dose between about 5E12 to 5E13 atoms/cm$^2$, creating P region, 19. This P/N diode, again reduces the junction breakdown voltage, allowing an increased level of discharge current to be obtained. This P/N diode, again as was the case for the diode used for the input, ESD protection device, has enhanced ESD current dissipation characteristics, due to the increased area of the P/N diode. Subsequent processing, although not shown, such as photoresist removal, insulator deposition, contact hole opening, and formation of metal contacts, identical to processes previously described for the input, ESD protection device, are performed to complete the I/O, ESD protection device, 20.

Figure 9:
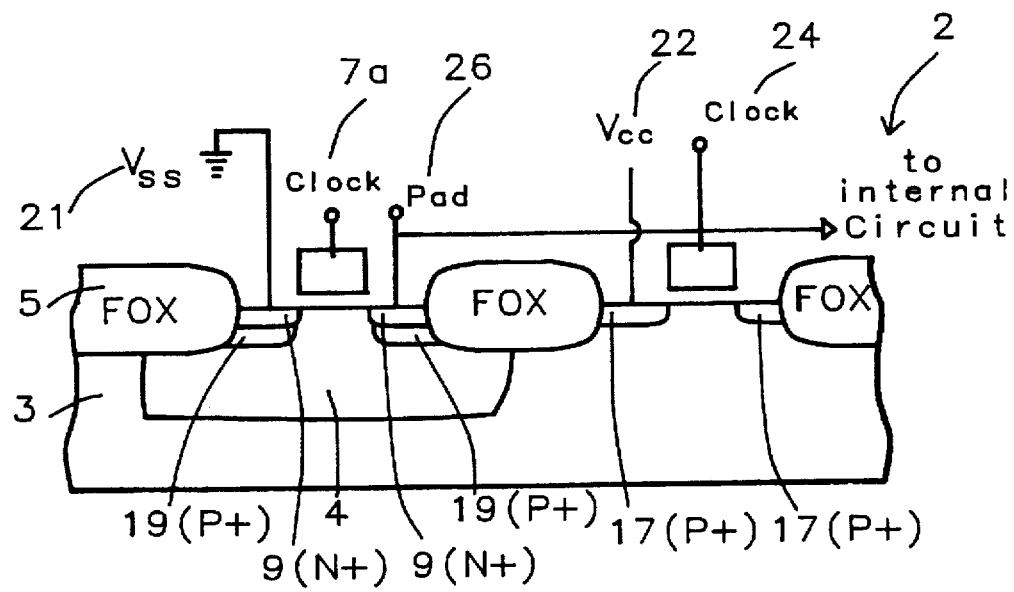
FIG. 9, which shows a cross-section of the output ESD protection device of this invention, with circuit connections indicated schematically.
Figure 10:
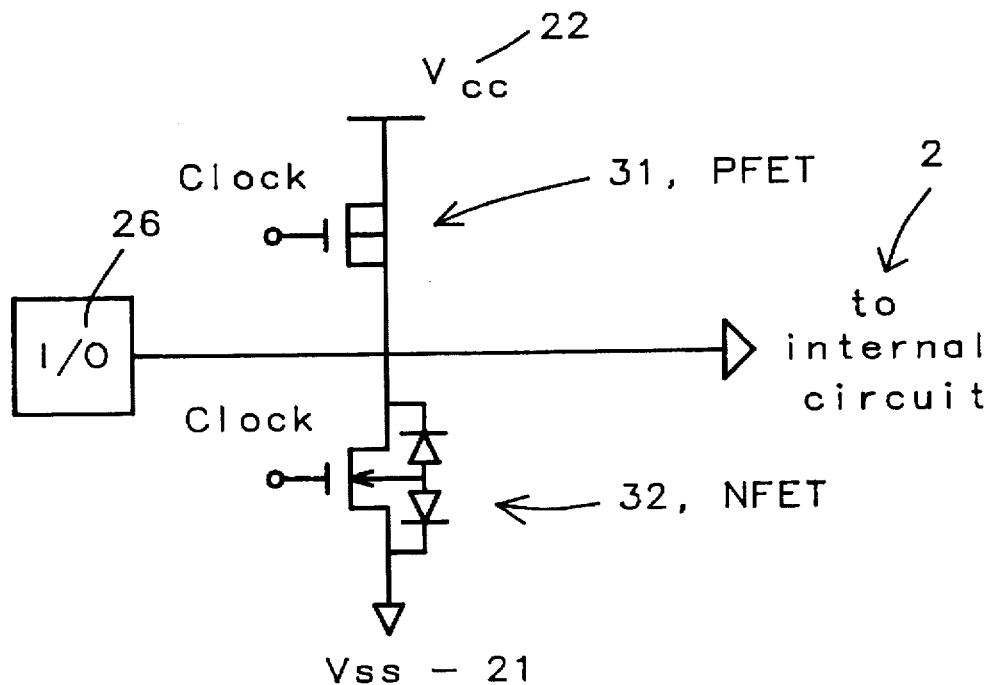
FIG. 10, is a circuit schematic of the output ESD protection device, of this invention.

FIGS. 9–10, indicate the way in which the output ESD protection device, of this invention, would be used at the output of a protected internal circuit. FIG. 9, schematically shows the structure previously described in FIG. 8, with Vss, 21, gate, 7a, and pad, 26, in the NFET region, as well as Vcc, 22, and clock, 24 for the PFET region of the ESD device, labeled. FIG. 10, shows the circuit schematic for the ESD device, acting as an output driver during normal circuit operation of the internal circuit, 2. The output pad, 26, is connected to one side of the NFET, 32, and also to PFET, 31, and to the protected internal circuit, 2. The PFET and NFET gates, 7a, are connected to the system clock. The other sides of NFET 32 and PFET 31, are connected to Vss, 21, and Vcc, 22.

ESD testing was performed using the Human Body Model on integrated circuits having a prior art ESD protection device, as well as on integrated circuits using the ESD protection device of this invention. For all cases the integrated circuits, using the ESD protection device described in this invention, withstood 6000 volts without damage, while integrated circuits, using prior art ESD protective devices, was only able to withstand between about 4000 to 4500 volts.

Although this invention has been described by forming a P/N diode, to enhance the ESD protect characteristics, using an N channel device, it can easily be used to create an ESD protection diode for a P channel device. This can be accomplished by a final implantation of a N type dopant, through a P+ source and drain region creating a P/N diode for the ESD protection device. In addition this invention can be used for ESD protection of CMOS as well as BiCMOS devices.

While this invention has been particularly shown and described with reference to, the preferred embodiments thereof, it will be understood by those skilled in the art that various changes in form and detail may be made without departing from the spirit and scope of this invention.

What is claimed is:

1. A method of fabricating a large area diode, for an ESD protection device, on a semiconductor substrate, used to reduce junction breakdown voltage, while simultaneously fabricating FET devices for an attached integrated circuit, comprising the steps of:

ion implanting a first conductivity imparting dopant into areas of said ESD protection devices, and into areas of said FET devices, to create P well regions;

growing a field oxide on areas of said ESD protection device, and on areas of said FET device;

growing a gate oxide on regions of said ESD protection device, and on regions of said FET device, not covered by said field oxide;

depositing a polysilicon layer on said gate oxide, and on said field oxide;

ion implanting a second conductivity imparting dopant into said polysilicon layer;

patterning of said polysilicon layer to form polysilicon gate structure for said FET device, while completely removing said polysilicon layer from said ESD protection device;

ion implanting a third conductivity imparting dopant into said FET device, not covered by said polysilicon gate structure, or by said field oxide, to form lightly doped source and drain regions, and into said ESD protection device, not covered by said field oxide, to form an ESD protection diode;

deposition of a first insulator layer;

anisotropic etching of said first insulator layer to form insulator sidewall spacer on sides of said polysilicon gate structure, for said FET device;

ion implanting a fourth conductivity imparting dopant into said FET device, not covered by said polysilicon gate structure, not covered by said insulator sidewall spacer, and not covered by said field oxide, to form heavily doped source and drain regions, and into said ESD protection device, not covered by said field oxide, to increase doping level of the N type portion of said ESD protection diode;

forming a photoresist mask to cover said FET device;

ion implanting a fifth conductivity imparting dopant into said ESD protection device, not covered by said field oxide, to increase doping level of the P type portion of said ESD protection diode;

removal of said photoresist mask;

deposition of a second insulator layer;

opening contact holes in said second insulator layer, to said heavily doped source and drain regions of said FET device, and to said ESD protection diode, of said ESD protection device;

deposition of a metal layer, and patterning of said metal layer to form metal contact structures to said heavily doped source and drain regions of said FET device, and to said ESD protection diode of said ESD protection device.

2. The method of claim 1, wherein said first conductivity imparting dopant, used to create P well region for said ESD protection device, and for said FET device, is boron, ion implanted at an energy between about 80 to 180 KeV, at a dose between about 1E12 to 5E13 atoms/cm$^2$.

3. The method of claim 1, wherein said field oxide is silicon dioxide, thermally grown in an oxygen-steam ambient, at a temperature between about 850° to 1050° C., to a thickness between about 3000 to 8000 Angstroms.

4. The method of claim 1, wherein said fourth conductivity imparting dopant, used to create heavily doped source and drain regions for said FET device, as well as increasing the doping level of said N type portion of said ESD protection diode, for said ESD protection device, is arsenic, ion implanted at an energy between about 30 to 80 KeV, at a dose between about 1E14 to 5E15 atoms/cm$^2$.

5. The method of claim 1, wherein said fifth conductivity imparting dopant, used to increase the doping level of the P type portion of said ESD protection diode, is boron, ion implanted at an energy between about 25 to 70 KeV, at a dose between about 5E12 to 5E13 atoms/cm$^2$.

6. The method of claim 1, wherein area of said ESD protection diode is between about 2 to 20 uM, by between about 50 to 400 uM.

7. The method of claim 1, wherein junction breakdown voltage of said ESD protection diode is between about 7 to 10 volts.

8. The method of claim 1, wherein said metal layer is aluminum, deposited using r.f. sputtering, to a thickness between about 3000 to 10000 Angstroms, and containing between about 0.5 to 3.0% copper, and between about 0 to 2.0% silicon.

9. A method of fabricating a large area diode, for an ESD protection device, with reduced junction breakdown voltage, on a semiconductor substrate, in which there are FET devices, comprising the steps of:

ion implanting a first conductivity imparting dopant into areas of said ESD protection device, create P well regions;

growing a field oxide on said ESD protection device;

ion implanting a second conductivity imparting dopant into regions of said ESD protection device, not covered by said field oxide, to increase doping level of of the N type portion of said large area, ESD protection diode;

ion implanting a third conductivity imparting dopant into said regions of said ESD protection device, not covered by said field oxide, to increase the doping level of the P type portion of said large area, ESD protection diode;

deposition an insulator layer on said ESD protection device;

opening contact holes in said insulator layer, to said large area, ESD protection diode, of said ESD protection device;

deposition of a metal layer; and patterning of said metal layer, to form metal contact structures to said large area, ESD protection diode, of said ESD protection device.

10. The method of claim 9, wherein said first conductivity imparting dopant, used to create P well region for said ESD protection device, is boron, ion implanted at an energy between about 80 to 180 KeV, at a dose between about 1E12 to 5E13 atoms/cm$^2$.

11. The method of claim 9, wherein said field oxide is silicon oxide, thermally grown in an oxygen-steam ambient, at a temperature between about 850° to 1050° C., to a thickness between about 3000 to 8000 Angstroms.

12. The method of claim 9, wherein said second conductivity imparting dopant, used to increase the doping level of said N type portion of said large area, ESD protection diode, is arsenic, ion implanted at an energy between about 30 to 80 KeV, at a dose between about 1E14 to 5E15 atoms/cm$^2$.

13. The method of claim 9, wherein said third conductivity imparting dopant, used to increase doping level of P type portion of said large area, ESD protection diode, is boron, ion implanted at an energy between about 25 to 70 KeV, at a dose between about 5E12 to 5E13 atoms/cm$^2$.

14. The method of claim 9, wherein area of said large area, ESD protection diode, is between about 2 to 20 uM, by between about 50 to 400 uM.

15. The method of claim 9, wherein junction breakdown voltage of said large area, ESD protection diode, is between about 7 to 10 volts.

16. The method of claim 9, wherein said metal layer is aluminum, deposited using r.f. sputtering, to a thickness between about 3000 to 10000 Angstroms, containing between about 0.5 to 3.0% copper, and between about 0 to 2.0% silicon.

* * * * *